(12) United States Patent
Hsieh

(10) Patent No.: US 8,872,586 B2
(45) Date of Patent: Oct. 28, 2014

(54) FOLDED-CASCODE AMPLIFIER

(71) Applicant: Broadcom Corporation, Irvine, CA (US)

(72) Inventor: Ming-Hung Hsieh, Taipei (TW)

(73) Assignee: Broadcom Corporation, Irvine, CA (US)

( * ) Notice: Subject to any disclaimer, the term of this patent is extended or adjusted under 35 U.S.C. 154(b) by 109 days.

(21) Appl. No.: 13/622,327

(22) Filed: Sep. 18, 2012

(65) Prior Publication Data
US 2014/0077878 A1    Mar. 20, 2014

(51) Int. Cl.
*H03F 3/45* (2006.01)
(52) U.S. Cl.
CPC ........................................ *H03F 3/45* (2013.01)
USPC ........................................... 330/253; 330/255
(58) Field of Classification Search
CPC ............................ H03F 3/45; H03F 13/622327
USPC ................................................ 330/253, 255
See application file for complete search history.

(56) References Cited

U.S. PATENT DOCUMENTS 6,580,760 B1   6/2003   Larsen
7,683,720 B1   3/2010   Yehui et al.

FOREIGN PATENT DOCUMENTS

WO    WO-99/03197 A2    1/1999

*Primary Examiner* — Robert Pascal
*Assistant Examiner* — Khiem Nguyen
(74) *Attorney, Agent, or Firm* — McDermott Will & Emery LLP

(57) ABSTRACT

An amplifier with gain boosting is disclosed according to an aspect of the subject technology. The gain boosting may be used to improve the noise figure of the amplifier, and may be achieved by feeding an input signal to the gates of multiple transistors in the amplifier, where each transistor provides a current gain contributing to the total current gain of the amplifier. The amplifier may also include an output driver stage for increasing the driving capability of the amplifier. The amplifier may also include a feedback resistor and an input resistor to obtain a gain with high linearity.

20 Claims, 6 Drawing Sheets

FOLDED-CASCODE AMPLIFIER

TECHNICAL FIELD

The present description relates generally to amplifiers and more particularly, to folded-cascode amplifiers.

BACKGROUND

A low-noise amplifier (LNA) may be used in the front-end receiver of a system to amplify an input signal, and output the amplified signal to other circuitry (e.g., tuner, demodulator, etc.) in the system for further processing. In order for the system to achieve high input sensitivity, it is important that the LNA have low noise and high linearity.

In a conventional LNA, linearity is limited by gm*Ro, where gm is the transconductance of the LNA and Ro is the output impedance of the LNA. As a result, the conventional LNA requires high current, and therefore high power, to achieve high linearity. In a convention LNA, inductors may be used to achieve low noise. However, inductors occupy a large chip area, significantly increasing the size of the LNA.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

Figure 1:
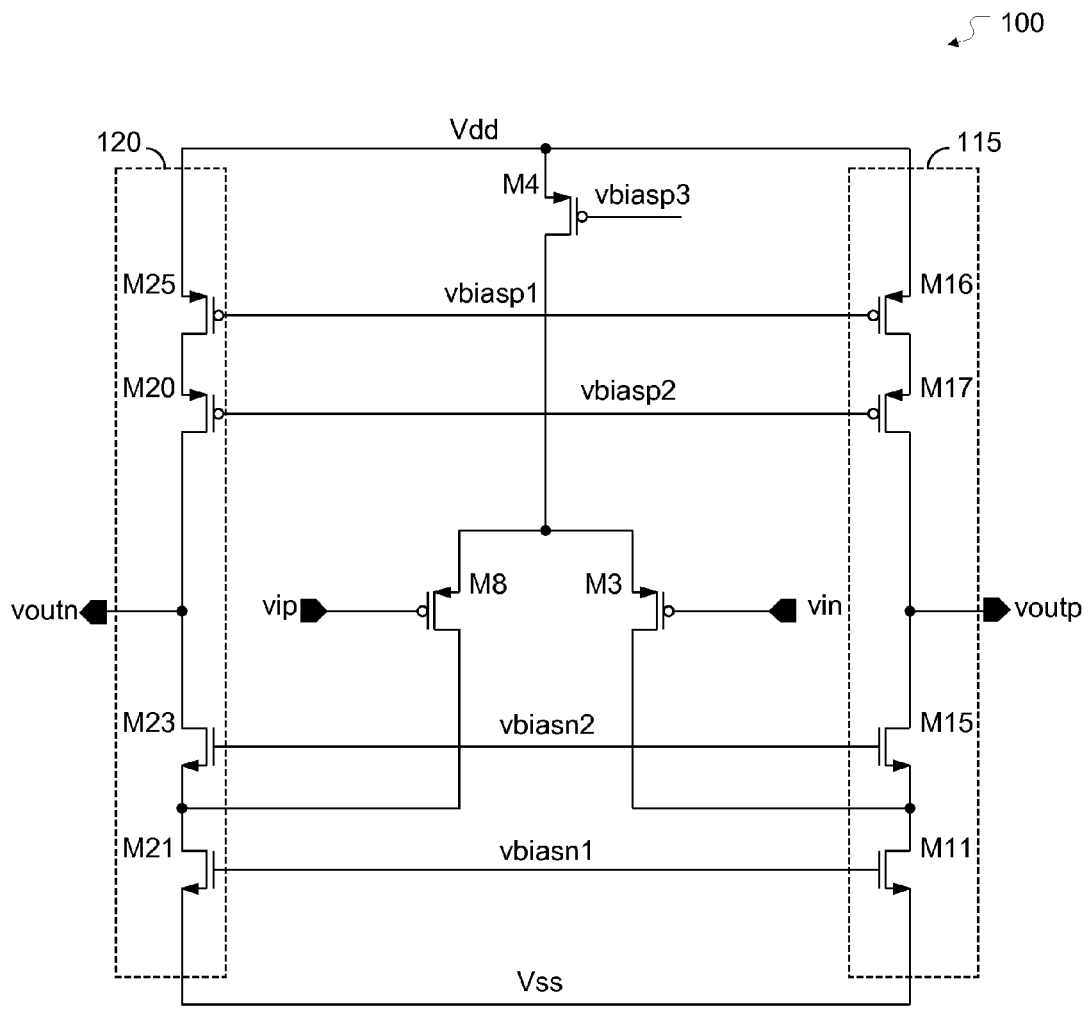
FIG. 1 illustrates an example of a folded-cascode amplifier.

FIG. 1 shows an example of a conventional differential folded-cascode amplifier 100. The amplifier 100 is configured to amplify a differential input signal comprising a first input signal vin and a second input signal vip, and output a differential output signal comprising a first output signal voutp and a second output signal voutn. The amplifier 100 includes a first input transistor M3 and a second input transistor M8 forming a differential input pair, and current-bias transistor M4 configured to provide a bias current that is split between the first and second input transistors M3 and M8. The gate of transistor M4 is biased by DC voltage vbiasp3.

The amplifier 100 further includes a first gain stage 115 coupled to the first input transistor M3. Together, the first input transistor M3 and the first gain stage 115 form a right half of the amplifier 100. The first gain stage 115 is coupled between power supply buses Vdd and Vss. The first gain stage 115 includes p-channel transistors M16, M17 and n-channel transistors M15 and M11 connected in a cascode configuration, in which the gates of transistors M16, M17, M15 and M11 are biased by DC voltages vbiasp1, vbiasp2, vbiasn2, and vbiasn1, respectively. Transistors M15 and M17 are common-gate cascode transistors that provide high impedance at the output of the first gain stage 115, and therefore high-voltage gain at the output of the first gain stage 115.

When the first input signal vin is fed to the gate of the first input transistor M3, the first input transistor M3 outputs a signal current of vin*gm3 at its drain. Approximately all of the output signal current of transistor M3 flows into transistor M15 of the first gain stage 115, resulting in an output current gain of approximately vin*gm3. This is because transistor M15 is connected in a common-gate configuration, and therefore has a low input impedance at its source.

In the right half of the amplifier 100, the noisiest sources are transistors M3, M11 and M16. The total noise current from the dominant noise source transistors (i.e., transistors M3, M11 and M16) is:

$$I_{n\_out\_stage} = V_{gn\_M3}*gm3 + I_{n\_M3} + V_{gn\_M11}*gm11 + + V_{gn\_M16}*gm16 + I_{n\_M16} \quad (1)$$

where $I_{n\_out\_stage}$ is the total noise current at the output, $V_{gn}$ is a noise voltage at the gate of the respective transistor, $I_n$ is a current noise of the respective transistor, and gm is the transconductance of the respective transistor. As discussed above, the right half of the amplifier 100 has an output current gain of approximately gm3*vin. As a result, the input referred noise for the right half of the amplifier is:

$$V_{n\_input\_refer} = I_{n\_out\_stage}/gm3 \quad (2)$$

where $V_{n\_input\_refer}$ is the input referred noise.

The amplifier 100 also includes a second gain stage 120 coupled to the second input transistor M8. Together, the second input transistor M8 and the second gain stage 120 form a left half of the amplifier 100. The second gain stage 120 includes n-channel transistors M21, M23 and p-channel transistors M20 and M25 connected in a cascode configuration, in which the gates of transistors M21, M23, M20 and M25 are biased by DC voltages vbiasn1, vbiasn2, vbiasp2, and vbiasp1, respectively. Transistors M23 and M20 are common-gate cascode transistors that provide high output impedance at the output of the second gain stage 120, and therefore high-voltage gain at the output of the second gain stage 120. The left half of the amplifier 100 has a similar input referred noise as the right half of the amplifier, which can be demonstrated by following the above analysis for the left half of the amplifier 100.

Figure 2:
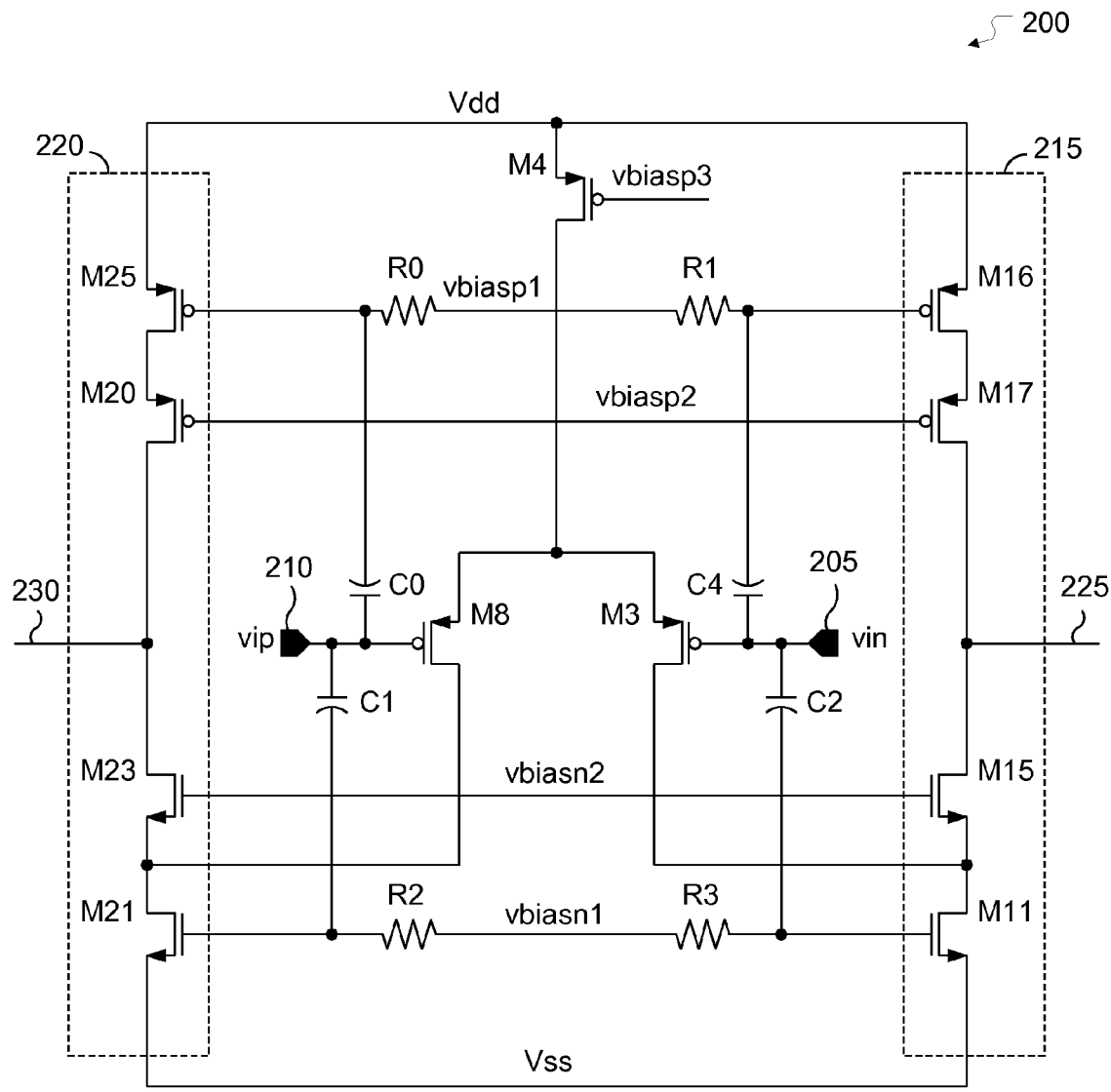
FIG. 2 illustrates an example folded-cascode amplifier with gain boosting according to an aspect of the subject technology.

FIG. 2 shows an example differential folded-cascode amplifier 200 (or "amplifier") with gain boosting according to an aspect of the subject technology. The gain boosting significantly reduces the input referred noise compared with the amplifier 100 in FIG. 1, thereby improving the noise figure, as discussed further below.

The right half of the amplifier 200 includes gain boosting capacitors C2 and C4 and resistors R1 and R3. Capacitors C2 and C4 pass the first input signal vin from the first input 205 of the amplifier 200 to the gates of transistors M11 and M16, respectively, while blocking the DC bias voltages vbiasn1 and vbiasp1, respectively, from the first input 205 of the amplifier 200. Thus, capacitors C2 and C4 provide gain paths from the first input 205 of the amplifier 200 to transistors M11 and M16, respectively, of the first gain stage 215. In some implementations, either or both of capacitors C2 and C4 may have a capacitance, for example, of approximately 4 pF.

Resistors R1 and R3 pass DC bias voltages vbiasp1 and vbiasn1 to the gates of transistors M16 and M11, respectively. In addition, resistors R1 and R3 prevent the gates of transistors M16 and M11, respectively, from being shorted to signal ground, allowing the voltage of the first input signal vin to be applied to the gates of transistors M16 and M11, respectively. In some implementations, either or both of resistors R1 and R3 may have a resistance, for example, of approximately 660 KΩ or other resistance.

The output current gain from transistor M11 is approximately vin*gm11, where gm11 is the transconductance of transistor M11. This is because almost all of the output signal current of transistor M11 flows into the low-impedance input of common-gate cascode transistor M15. The output current gain from transistor M16 is approximately vin*gm16, where gm16 is the transconductance of transistor M16. Thus, the total output current gain for the right half of the amplifier is approximately vin*(gm3+gm11+gm16). As a result, the input referred noise for the right half of the amplifier 200 is:

$$V_{n\_input\_refer} = I_{n\_out\_stage}/(gm3+gm11+gm16) \quad (3)$$

which is significantly less than the input referred noise of the amplifier 100 in FIG. 1. The input referred noise is reduced by a factor of (gm3+gm11+gm16)/gm3. For example, if gm3=gm11=gm16, then the input referred noise is reduced by a factor of three and the gain is increased by a multiple of three. Therefore, the gain boosting according to the subject technology can significantly improve the noise figure of the amplifier 200.

In this aspect, transistors M3, M11 and M16 contribute to the total current gain of the right half of the amplifier 200, and therefore may be considered current-gain transistors.

The left half of the amplifier 200 includes gain boosting capacitors C0 and C1 and resistors R0 and R2. Capacitors C0 and C1 pass the second input signal vip from the second input 210 of the amplifier 200 to the gates of transistors M25 and M21, respectively, while blocking the DC bias voltages vbiasp1 and vbiasn1, respectively, from the second input 210 of the amplifier 200. Thus, capacitors C0 and C1 provide gain paths from the second input 210 of the amplifier 200 to transistors M25 and M21, respectively, of the second gain stage 220. In some implementations, either or both of capacitors C0 and C1 may a capacitance, for example, of approximately 4 pF.

Resistors R0 and R2 pass DC bias voltages vbiasp1 and vbiasn1 to the gates of transistors M25 and M21, respectively. In addition, resistors R0 and R2 prevent the gates of transistors M25 and M21, respectively, from being shorted to signal ground, allowing the voltage of the second input signal vip to be applied to the gates of transistors M25 and M21, respectively. In some implementations, either or both of resistors R0 and R2 may have a resistance, for example, of approximately 660 KΩ.

The output current gain from transistor M25 is approximately vip*gm25, and the output current grain from transistor M21 is approximately vip*gm21, where gm25 and gm21 are the transconductances of transistors M25 and M21, respectively. Thus, the total output current gain for the left half of the amplifier is approximately vip*(gm8+gm21+gm25). As a result, the input referred noise for the left half of the amplifier 200 is reduced by a factor of (gm8+gm21+gm25)/gm8 compared with the amplifier 100 in FIG. 1.

In this aspect, transistors M8, M21 and M25 contribute to the total current gain of the left half of the amplifier 200, and therefore may be considered current-gain transistors.

Figure 3:
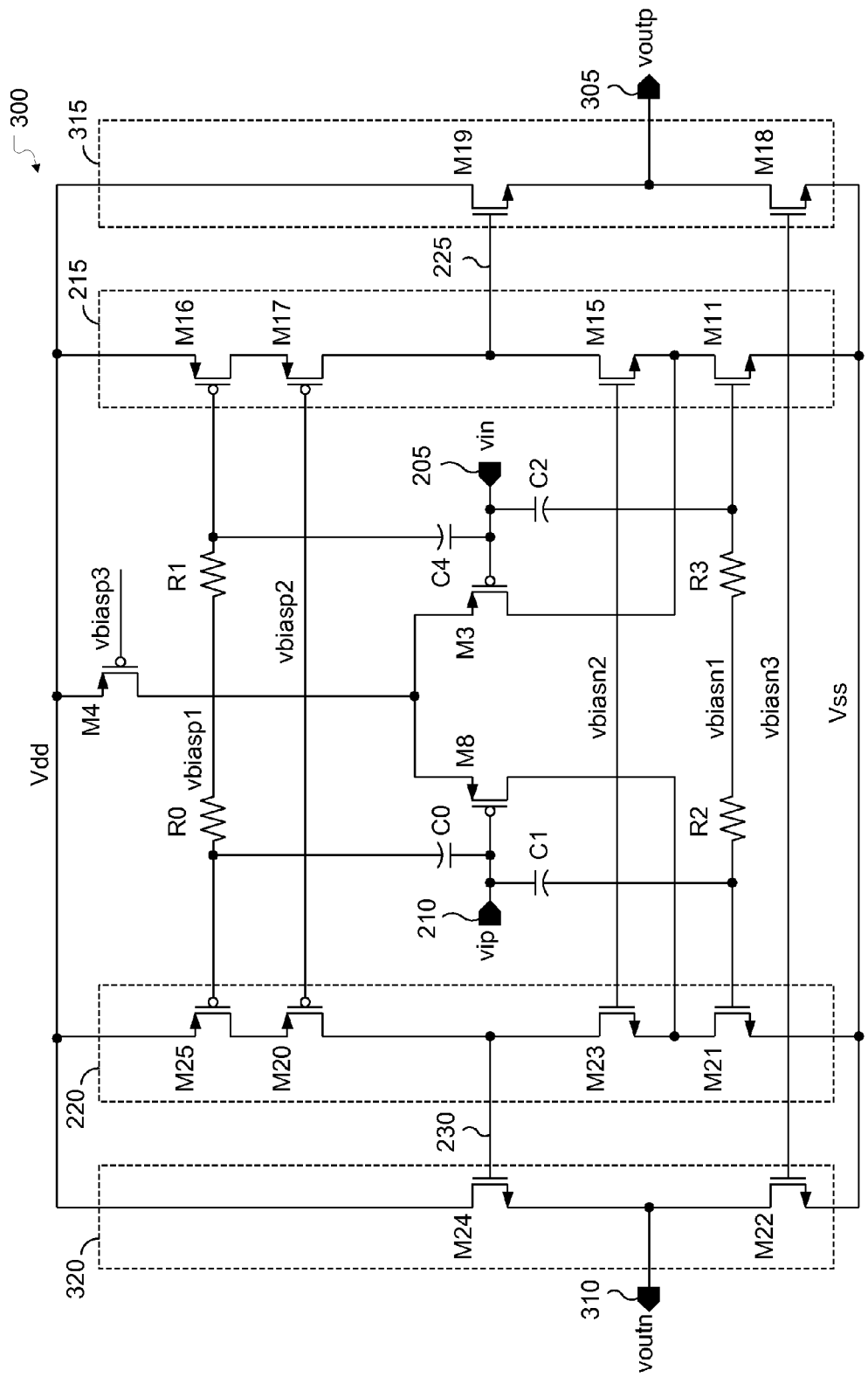
FIG. 3 illustrates an example folded-cascode amplifier with gain boosting and an output driver stage according to an aspect of the subject technology.

As discussed above, the first gain stage 215 of the amplifier 200 has a high output impedance due to cascode transistors M15 and M17. Similarly, the second gain stage 220 of the amplifier 200 has a high output impedance due to cascode transistors M23 and M20. For example, each gain stage may have an output impedance of approximately 500Ω. As a result, the amplifier 200 may not be able to drive a low resistance load well (e.g., a load having a resistance on the order of 100Ω). This is because the high gain of the amplifier 200 may be significantly reduced when coupled to a load having a resistance significantly lower than the output impedance of the amplifier 200. In order to drive a low resistance load, the amplifier may be modified as shown in FIG. 3 according to one aspect of the subject technology.

In this aspect, the right half of the amplifier 300 further includes a first output driver stage 315 coupled to the output 225 of the first gain stage 215. The first output driver stage 315 includes transistors M18 and M19. Transistor M19 is connected in a source follower (i.e., common drain) configuration with the gate of transistor M19 coupled to the output 225 of the first gain stage 215, and a source coupled to a first output 305 of the amplifier 300, which outputs voutp. Transistor M19 provides a low output impedance (e.g., on the order of 10Ω) at the first output 305 of the amplifier 300, allowing the right half of the amplifier 300 to drive a low resistance load (e.g., a load having a resistance on the order of 100Ω). Transistor M19 also provides a high input impedance to the first gain stage 215, and therefore maintains the high-voltage gain provided by the first gain stage 215. Transistor M18 establishes the bias current for transistor M19, in which the gate of transistor M18 is biased by DC voltage vbiasn3.

Similarly, the left half of the amplifier 300 further includes a second output driver stage 320 coupled to the output 230 of the second gain stage 220. The output driver stage 320 includes transistors M24 and M22. Transistor M24 is connected in a source follower (i.e., common drain) configuration with the gate of transistor M24 coupled to the output 230 of the second gain stage 220, and a source coupled to a second output 310 of the amplifier 300, which outputs voutn. Transistor M24 provides a low output impedance (e.g., on the order of 10Ω) at the second output 310 of the amplifier 300, allowing the left half of the amplifier 300 to drive a low resistance load (e.g., a load having a resistance on the order of 100Ω). Transistor M24 also provides a high input impedance to the second gain stage 220, and therefore maintains the high-voltage gain provided by the second gain stage 220. Transistor M22 establishes the bias current for transistor M24, in which the gate of transistor M22 is biased by DC voltage Vbiasn3.

Figure 4:
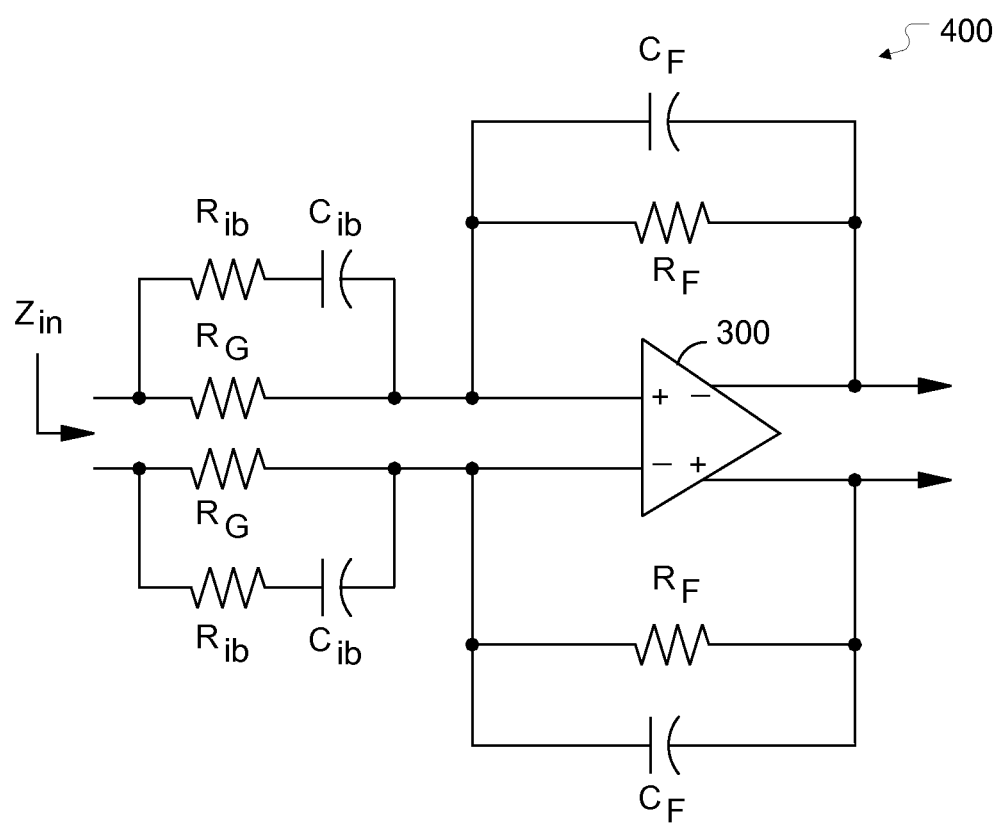
FIG. 4 illustrates an example amplifier according to an aspect of the subject technology.

FIG. 4 shows an example amplifier 400 capable of achieving high linearity. The amplifier 400 may include the folded-cascode amplifier 300 shown in FIG. 3, an input resistor $R_G$ coupled to each input of the amplifier 300 and a feedback resistor $R_F$ coupled between each output and a corresponding input of the amplifier 300. Because the amplifier 300 has a high gain (e.g., at least one order of magnitude higher than $R_F/R_G$), the amplifier 400 has a linear gain of approximately $R_F/R_G$. Thus, the amplifier 400 can achieve high linearity without the use of inductors, allowing the amplifier 400 to be integrated within a smaller chip area (e.g., about half the chip area of an amplifier with inductors).

In one aspect, each input resistor $R_G$ may have a low resistance. For example, the amplifier 400 may receive an input signal from a low-impedance source (e.g., a coaxial cable), and each input resistor $R_G$ may have a low resistance (e.g., within a range of 50Ω to 100Ω) to provide impedance matching with the low-impedance source. As a result, each feedback resistor $R_F$ may also have a relatively low resistance. For example, for a gain of 6 dB, each input resistor $R_G$ may have a resistance of 50Ω and each feedback resistor $R_F$ may have a resistance of 100Ω. In this example, the amplifier 400 has a differential input resistance $Z_{in}$ of 100 Ω.

Because the output driver stages 315 and 320 of the amplifier 300 have low output impedances (e.g., on the order of 10Ω), they have high driving capability (i.e., capable of driving low resistance loads). This enables the amplifier 300 to drive the low-resistance feedback resistors $R_F$ well. It should be appreciated that the amplifier 300 is not limited to use in the amplifier 400 shown in FIG. 4, and may be used in other amplifier designs, including other amplifier designs using low-resistance feedback resistors.

The amplifier 400 may be used, for example, in the front-end receiver of a set top box or cable modem to amplify a wideband signal from a cable. In some implementations, the wideband signal may have a frequency range of 50 MHz to 1 GHz. In other implementations, other frequency ranges can be used. The wideband signal may originate from a cable service provider or an antenna coupled to the other end of the cable. As discussed above, each input resistor $R_G$ of the amplifier 400 may have low resistance (e.g., 50Ω) in order to provide impedance matching with a low-impedance cable. The impedance matching minimizes signal loss between the cable and the amplifier 400. The resulting amplified signal may be output to other circuitry (e.g., a tuner, demodulator, etc.) for further signal processing. It should be appreciated that the amplifier 400 is not limited to the above example applications, and may be used in other applications requiring signal amplification.

The amplifier 400 may further include a capacitor $C_F$ coupled to each feedback resistor $R_F$, and a capacitor $C_{ib}$ and a resistor $R_{ib}$ coupled to each input resistor $R_G$ to control the bandwidth of the amplifier 400 without using inductors, as shown in FIG. 4. In this aspect, each capacitor $C_F$ may be coupled in parallel with the respective feedback resistor $R_F$ to form a low-pass filter with a cutoff frequency of approximately:

$$f_c = 1/(2\pi R_F C_F) \qquad (4)$$

The purpose of the low-pass filter is to provide a relatively constant gain across the frequency range of the signal being amplified while reducing gain for higher frequency signals. For example, the signal being amplified may be a wideband signal from a cable having a frequency range of 50 MHz to 1 GHz. In this example, the low-pass filter may have a cutoff frequency of approximately 10 GHz. The cutoff frequency is made higher than the maximum frequency of the wideband signal. This is because the low-pass filter starts reducing the gain before the cutoff frequency is reached. Placing the cutoff frequency of the low-pass filter away from the maximum frequency of the wideband signal helps ensure that the gain stays approximately flat within the frequency range of the wideband signal. In this example, each feedback resistor $R_F$ may have a resistance of 100Ω and each capacitor $C_F$ may have a capacitance of 150 fF.

Each capacitor $C_{ib}$ and the respective resistor $R_{ib}$ form a high-pass filter coupled in parallel with the respective input resistor $R_G$. As a result, the input resistance for each input of the amplifier 400 may be approximately $R_G$ below a cutoff frequency and approximately $R_G \| R_{ib}$ at or above the cutoff frequency (e.g., 1 GHz), where the cutoff frequency is approximately:

$$f_c = 1/(2\pi(R_{ib}+R_G)C_{ib}) \qquad (5)$$

Thus, the input resistance is reduced to $R_G \| R_{ib}$ at or above the cutoff frequency. The reduced input resistance may be used to compensate for gain loss in the amplifier 400 at frequencies around the cutoff frequency. The gain loss may be due to gain loss in the amplifier 300, gain loss from the low-pass filter and/or other gain loss.

For example, the gain loss around the cutoff frequency (e.g., 1 GHz) may be quantified by a loss factor GF, where GF<1 around the cutoff frequency and GF is approximately one at frequencies below the cutoff frequency. Thus, the gain around the cutoff frequency may be approximately $R_F/R_G \| R_{ib} * GF$, and the gain at lower frequencies may be approximately $R_F/R_G$. In this example, the resistance of $R_{ib}$ may be chosen such that $R_F/R_G \| R_{ib} * GF$ is approximately equal to $R_F/R_G$ so that the gain is approximately flat across the frequency range of the wideband signal being amplified. In this example, without the high-pass filter, the gain would be reduce to approximately $R_F/R_G * GF$ around the cutoff frequency (e.g., 1 GHz). In this example, each resistor $R_{ib}$ may have a resistance of 400Ω and each capacitor $C_{ib}$ may have a capacitance of 400 fF. The high-pass filter is optional and may be omitted, for example, when there is no appreciable gain loss within the frequency range of the signal being amplified.

Figure 5:
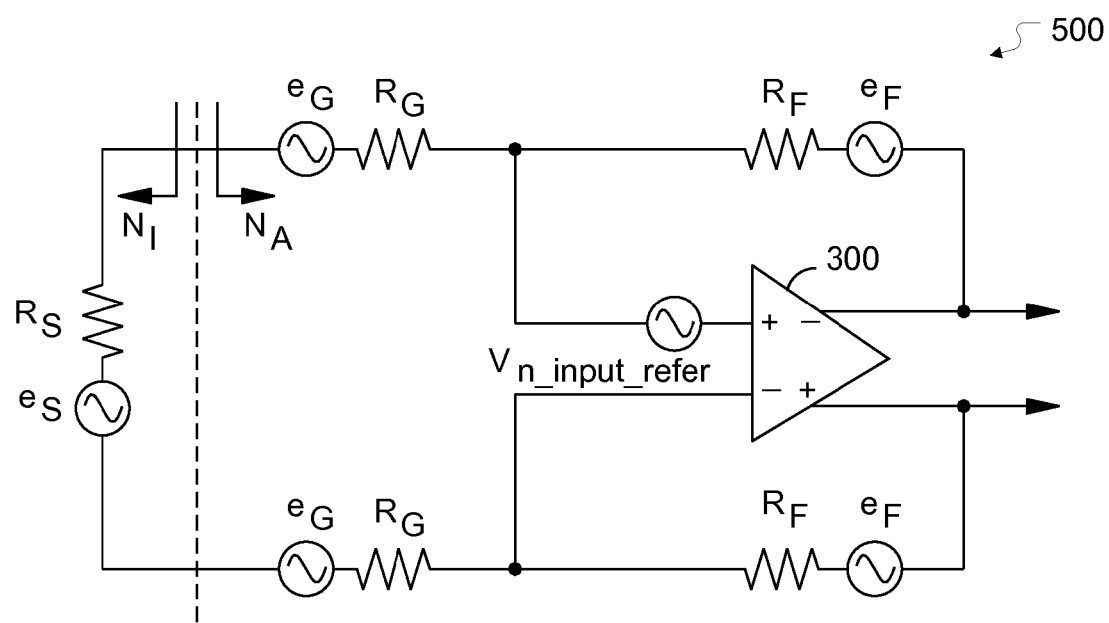
FIG. 5 illustrates an example of a noise model of the amplifier according to an aspect of the subject technology.

As discussed above, gain boosting reduces the input referred noise of an amplifier, thereby improving the noise figure of the amplifier. To demonstrate this, FIG. 5 shows a noise model for the amplifier 400 with input and feedback resistors. In FIG. 5, $e_F$ and $e_G$ represent noise from resistors $R_F$ and $R_G$, respectively, $V_{n\_input\_refer}$ is the input-referred noise for the right half of the amplifier, $R_S$ is a resistor representing the resistance of a source port, and $e_F$ represents noise from resistor $R_S$.

Using the noise model in FIG. 5, the noise figure (NF) of the amplifier 400 may be given by:

$$NF = \frac{SNR_I}{SNR_O} \qquad (6)$$

$$= \frac{\frac{S_I}{N_I}}{\frac{G \times S_I}{G(N_I + N_A)}}$$

$$= 1 + \frac{N_A}{N_I}$$

where $SNR_I$ is the signal-to-noise ratio (SNR) at the input, $SNR_O$ is the SNR at the output, G is the power gain of the amplifier, $N_A$ is noise at the input from the amplifier, and $N_I$ is noise at the input from the source port.

The noise at the input from the source port may be given by:

$$N_I = 4KTR_S \left(\frac{2R_G}{R_S + 2R_G}\right)^2 \qquad (7)$$

where $4KTR_S$ is thermal noise of source port resistor $R_S$, K is the Boltzmann's constant, and T is temperature.

The noise at the input from the amplifier may be given by:

$$N_A = C_1 \times V_{n\_input\_refer}^2 + C_2 \times 2e_G^2 + C_3 \times e_F^2 \qquad (8)$$

where $$C_1 = \left[\left(1 + \frac{2R_F}{R_S + 2R_G}\right)\left(\frac{R_F}{R_G}\right)^{-1}\right]^2$$

$$= \left(\frac{R_G}{R_F} + \frac{2R_G}{R_S + 2R_G}\right)^2,$$

$$C_2 = \left[\left(\frac{2R_F}{R_S + 2R_G}\right)\left(\frac{R_F}{R_G}\right)^{-1}\right]^2$$

$$= \left(\frac{2R_G}{R_S + 2R_G}\right)^2,$$

and $$C_3 = \left[\left(\frac{R_F}{R_G}\right)^{-1}\right]^2$$

$$= \left(\frac{R_G}{R_F}\right)^2.$$

Inserting the expressions for $C_1$, $C_2$ and $C_3$ into Equation (8) yields:

$$N_A = \left(\frac{R_G}{R_F} + \frac{2R_G}{R_S + 2R_G}\right)^2 \times V_{n\_input\_refer}^2 + \qquad (9)$$

$$\left(\frac{2R_G}{R_S + 2R_G}\right)^2 \times 2 \times 4KTR_G + \left(\frac{R_G}{R_F}\right)^2 \times 4KTR_F$$

Finally, inserting Equations (7) and (9) for $N_I$ and $N_A$, respectively, into Equation (6) results in the following expression for the noise figure (NF):

$$NF = 1 + \left(\frac{R_S + 2R_G}{2R_F} + 1\right)^2 \times \frac{V_{n\_input\_refer}^2}{4KTR_S} + 2 \times \left(\frac{R_G}{R_S}\right) + \frac{(R_S + 2R_G)^2}{2R_F \times R_S} \qquad (10)$$

As Equation (10) clearly demonstrates, reducing the input referred noise $V_{n\_input\_refer}$ for the right half of the amplifier using gain boosting reduces the noise figure (NF), thereby improving the noise figure (NF) of the amplifier. It can be shown that reducing the input referred noise for the left half of the amplifier using gain boosting similarly improves the noise figure (NF) by carrying out the above analysis using the input referred noise for the left half of the amplifier.

An amplifier according to aspects of the subject technology may be fabricated using a complementary metal-oxide-semiconductor (CMOS) process, or other semiconductor-fabrication process. The transistors in the amplifier may be implemented using metal-oxide-semiconductor field-effect transistors (MOSFETs), or other type of transistors. Some or all of the capacitors and/or resistors in the amplifier may be integrated with the transistors on the same chip.

Figure 6:
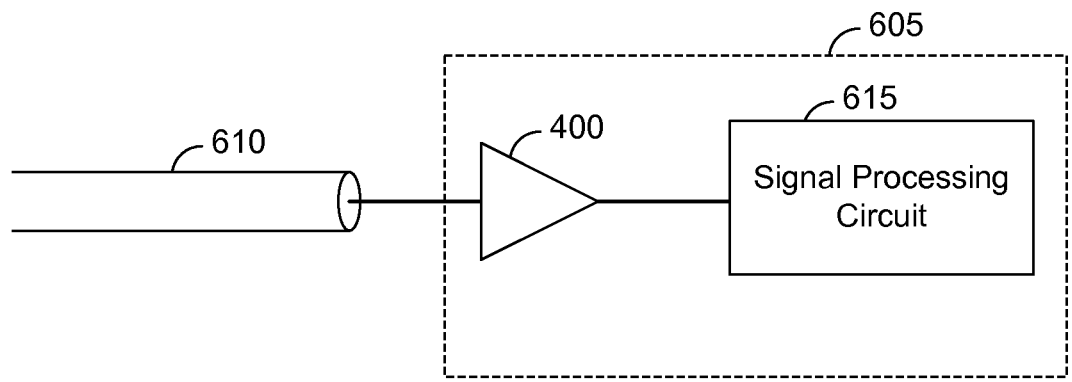
FIG. 6 illustrates an example system according to an aspect of the subject technology.

FIG. 6 illustrates an example system 605 (e.g., a cable modem) in which the amplifier 400 may be used. In this example, the system 605 includes the amplifier 400 and a signal processing circuit 615. For ease of illustration, the differential input and differential output of the amplifier 400 is shown as a single input and single output, respectively, in FIG. 6.

The input of the amplifier 400 is coupled to one end of a cable 610 (e.g., coaxial cable) to receive an input signal (e.g., a wideband signal) from the cable 610. The other end of the cable 610 may be coupled to a cable service provider or satellite dish. The amplifier 400 amplifies the input signal and outputs the amplified signal to the signal processing circuit 615 for further processing. The signal processing circuit 615 may include a tuner, a demodulator and/or other circuit for processing the amplified signal output by the amplifier 400. In some implementations, the cable 610 may have a low impedance and the amplifier 400 may have a low input impedance to provide impedance matching with the cable 610, and thus reduce signal attenuation between the cable 610 and the amplifier 400.

The previous description is provided to enable any person skilled in the art to practice the various aspects described herein. Various modifications to these aspects will be readily apparent to those skilled in the art, and the generic principles defined herein may be applied to other aspects. For example, although aspects of the subject technology are described above using the example of a fully-differential amplifier, it should be appreciated that the subject technology may be used in a single-ended amplifier or a partial-differential amplifier. For example, a single-ended amplifier may be implemented using a single gain stage with gain boosting instead of using two gain stages. Further, it should be appreciated that gain boosting may be achieved using just one transistor in a gain stage instead of two transistors. For example, gain boosting may be achieved in an amplifier by providing just one gain path from an input of the amplifier to the gate of one of the transistors in a gain stage, instead of providing two gain paths from the input of the amplifier to the gates of two transistors in the gain stage.

Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An amplifier, comprising:
   a first current-gain transistor having a gate coupled to an input of the amplifier;
   a second current-gain transistor having a gate coupled to the input of the amplifier via a first gain path;
   a first cascode transistor having a source coupled to a drain of the first current-gain transistor and a drain of the second current-gain transistor, a gate coupled to a first DC bias voltage, and a drain coupled to a gain output of the amplifier;
   a third current-gain transistor having a gate coupled to the input of the amplifier via a second gain path;
   a second cascode transistor having a source coupled to a drain of the third current-gain transistor, a gate coupled to a second DC bias voltage, and a drain coupled to the gain output of the amplifier;
   a first resistor coupled between the gate of the second current-gain transistor and a third DC bias voltage; and
   a second resistor coupled between the gate of the third current-gain transistor and a fourth DC bias voltage,
   wherein the third DC bias voltage is different from the fourth DC bias voltage.

2. The amplifier of claim 1, wherein the first gain path comprises a first capacitor coupled between the input of the amplifier and the gate of the second current-gain transistor, and the second gain path comprises a second capacitor coupled between the input of the amplifier and the gate of the third current-gain transistor.

3. The amplifier of claim 1, further comprising a source-follower transistor having a gate coupled to the gain output of the amplifier, and a source coupled to a driver output of the amplifier.

4. The amplifier of claim 3, further comprising:
   a feedback resistor coupled between the driver output of the amplifier and the input of the amplifier; and
   an input resistor coupled to the input of the amplifier.

5. The amplifier of claim 4, wherein the input resistor has a resistance within a range of 50Ω to 100Ω.

6. The amplifier of claim 3, further comprising a current-bias transistor coupled to the source of the source-follower transistor, and configured to provide a bias current for the source-follower transistor.

7. The amplifier of claim 6, wherein a source of the current-bias transistor is coupled to a source of the second current-gain transistor.

8. The amplifier of claim 6, wherein a drain of the current-bias transistor is coupled to the source of the source-follower transistor.

9. An amplifier, comprising:
   a first current-gain transistor having a gate coupled to an input of the amplifier;
   a second current-gain transistor having a gate coupled to the input of the amplifier via a gain path;
   a cascode transistor having a source coupled to a drain of the first current-gain transistor and a drain of the second current-gain transistor, a gate coupled to a first DC bias voltage, and a drain coupled to a gain output of the amplifier;
   a source-follower transistor having a gate coupled to the gain output of the amplifier, and a source coupled to a driver output of the amplifier; and
   a current-bias transistor coupled to the source of the source-follower transistor, and configured to provide a bias current for the source-follower transistor.

10. The amplifier of claim 9, wherein the gain path comprises a capacitor coupled between the input of the amplifier and the gate of the second current-gain transistor.

11. The amplifier of claim 10, further comprising a resistor coupled between the gate of the second current-gain transistor and a second DC bias voltage.

12. The amplifier of claim 9, further comprising:
    a feedback resistor coupled between the driver output of the amplifier and the input of the amplifier; and
    an input resistor coupled to the input of the amplifier.

13. The amplifier of claim 12, wherein the input resistor has a resistance within a range of 50Ω to 100Ω.

14. The amplifier of claim 9, wherein a source of the current-bias transistor is coupled to a source of the second current-gain transistor.

15. An amplifier, comprising:
    a first current-gain transistor having a gate coupled to an input of the amplifier;
    a second current-gain transistor having a gate coupled to the input of the amplifier via a gain path;
    a first cascode transistor having a source coupled to a drain of the first current-gain transistor, a gate coupled to a first DC bias voltage, and a drain coupled to a gain output of the amplifier;
    a second cascode transistor having a source coupled to a drain of the second current-gain transistor, a gate coupled to a second DC bias voltage, and a drain coupled to the gain output of the amplifier;
    a source-follower transistor having a gate coupled to the gain output of the amplifier, and a source coupled to a driver output of the amplifier; and
    a current-bias transistor coupled to the source of the source-follower transistor, and configured to provide a bias current for the source-follower transistor.

16. The amplifier of claim 15, wherein the gain path comprises a capacitor coupled between the input of the amplifier and the gate of the second current-gain transistor.

17. The amplifier of claim 16, further comprising a resistor coupled between the gate of the second current-gain transistor and a third DC bias voltage.

18. The amplifier of claim 15, further comprising:
    a feedback resistor coupled between the driver output of the amplifier and the input of the amplifier; and
    an input resistor coupled to the input of the amplifier.

19. The amplifier of claim 18, wherein the input resistor has a resistance within a range of 50Ω to 100Ω.

20. The amplifier of claim 15, wherein a source of the current-bias transistor is coupled to a source of the second current-gain transistor.

* * * * *